United States Patent
Ahn et al.

(10) Patent No.: US 7,112,849 B2
(45) Date of Patent: Sep. 26, 2006

(54) METHOD OF PREVENTING SEMICONDUCTOR LAYERS FROM BENDING AND SEMICONDUCTOR DEVICE FORMED THEREBY

(75) Inventors: Dong-Ho Ahn, Yongin-shi (KR); Ho-Kyu Kang, Yongin-shi (KR); Geum-Jong Bae, Yongin-shi (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 0 days.

(21) Appl. No.: 11/059,884

(22) Filed: Feb. 17, 2005

(65) Prior Publication Data

US 2005/0142706 A1 Jun. 30, 2005

Related U.S. Application Data

(62) Division of application No. 09/861,443, filed on May 18, 2001, now Pat. No. 6,881,645.

(30) Foreign Application Priority Data

Aug. 17, 2000 (KR) .................. 10-2000-0047585
Nov. 1, 2000 (KR) .................. 10-2000-0064715

(51) Int. Cl.
*H01L 27/01* (2006.01)

(52) U.S. Cl. .................. 257/347; 438/439; 438/400; 438/791; 438/424; 257/510; 257/499; 257/649

(58) Field of Classification Search ........... 438/424, 438/439, 400, 791; 257/347, 510, 499, 649
See application file for complete search history.

(56) References Cited

U.S. PATENT DOCUMENTS

| 4,631,803 | A | * | 12/1986 | Hunter et al. | .............. 438/426 |
| 4,775,641 | A | * | 10/1988 | Duffy et al. | .................. 117/8 |
| 6,010,660 | A | * | 1/2000 | Pozdeev | .................... 419/29 |
| 6,238,998 | B1 | * | 5/2001 | Leobandung | ............. 438/404 |

* cited by examiner

*Primary Examiner*—Matthew Smith
*Assistant Examiner*—Nicholas J. Tobergte
(74) *Attorney, Agent, or Firm*—F. Chau & Associates, LLC

(57) ABSTRACT

Disclosed herein are various methods for preventing bending of a patterned SOI layer during trench sidewall oxidation, the methods comprising providing a patterned SOI layer having at least one trench, said patterned SOI layer disposed upon an underlying buried silicon oxide layer; and blocking diffusion of oxygen between said patterned SOI and buried silicon oxide layer.

8 Claims, 9 Drawing Sheets

METHOD OF PREVENTING SEMICONDUCTOR LAYERS FROM BENDING AND SEMICONDUCTOR DEVICE FORMED THEREBY

CROSS-REFERENCE TO RELATED APPLICATION

This application is a divisional of U.S. application Ser. No.: 09/861,443 filed on May 18, 2001, now U.S. Pat. No. 6,881,645 the disclosure of which in its entirety is incorporated by reference herein.

This application claims priority to Korean Patent Application No. 2000-47585, filed on Aug. 17, 2000 and Korean Patent Application No. 2000-64715, filed on Nov. 11, 2000, the contents of both of which are herein incorporated by reference in their entirety.

BACKGROUND OF THE INVENTION

1. Technical Field

The present invention generally relates to a method of forming a semiconductor device on a silicon on insulator (SOI) type substrate, and a semiconductor device formed thereby. More specifically, a method of preventing a SOI layer from bending around an active region when trench device isolation is performed on the SOI-type substrate and a semiconductor device formed thereby.

2. Discussion of Related Art

When adjacent semiconductor layers having different impurity types are formed the interface between the layers acts as an isolation barrier. Commonly employed junction-type isolation techniques are usually not suitable for high-voltage junctions in semiconductor layers because the voltage-resistance characteristics are weak at high voltage junction surfaces. Further, unwanted current may flow a junction depletion layer caused by a radiation ray such as a gamma ray, rendering the isolation technique inefficient in a high-radiation circumstance. Therefore, a SOI-type semiconductor device where a device region is completely isolated by an insulating layer is generally used in high-performance semiconductor devices such as a central processing unit (CPU).

Mesa, local oxidation of silicon (LOCOS), and shallow trench isolation (STI) techniques have widely been used to isolate devices on an SOI-type substrate. The STI technique prevents a bird's beak phenomenon that occurs in the LOCOS technique. The bird's beak phenomenon practically decreases a device formation area. Accordingly, the STI technique is generally applied to a highly integrated semiconductor device.

When the STI technique is applied for device isolation on an SOI-type substrate, an undesirable bending phenomenon occurs in a silicon layer composing an active region due to a structural characteristic of the substrate. This problem is illustrated in FIGS. 1 through 3.

Referring to FIG. 1, a typical SOI-type substrate may comprise a lower silicon layer 10, a buried silicon oxide layer 11, and an SOI layer 13 that are sequentially stacked. The SOI layer 13 composes an active region. In order to perform STI, a pad oxide layer 15 and a silicon nitride layer 17 serving as an etch-stop layer are sequentially stacked on an SOI layer of an SOI-type substrate. Using a photoresist layer 19 the silicon nitride layer 17 is then patterned to form a pattern made of silicon nitride.

Referring to FIG. 2, using the pattern of the silicon nitride layer 17 as an etching mask, the exposed pad oxide layer 15 and the SOI layer thereunder are etched to form a trench and a patterned SOI layer 23. Therefore, the bottom of the trench is formed of the silicon oxide layer 11.

Referring to FIG. 3, a sidewall oxide layer 25 is formed on the sidewalls of the trench. The sidewall oxide layer 25 results from a heat treatment for curing crystalline defects. An interface between the patterned SOI layer 23' and the buried silicon oxide layer 11 serves as an oxygen diffusion path. Because oxygen is smoothly supplied to the exposed sidewall according to a trench shape, an oxide layer is extended from the trench into an active region, on a bottom of the patterned SOI layer 23'. Accordingly, a wedging thermal oxide layer 24 is penetrated between the SOI layer 23' and the buried silicon oxide layer. The material of the thermal oxide wedges 24 are of greater volume than the original silicon and therefore expand, thereby lifting the immediately adjacent portion 26 of the patterned SOI layer 23' from the trench. Hence, the SOI layer is bent.

When bending occurs, stress is applied to the SOI layer by a lifting force from the sidewall of the trench. If the following ion implantation process is then carried out, a crystalline defect is created in the SOI layer. The created crystalline defect is easily expanded by the lifting force, and increases junction leakage currents. Even though the crystalline defect does not occur during ion implantation, a depth of the SOI layer is partially changed and that of practical ion implantation is also changed by the bending. This leads to instability of threshold voltages (A comparison of oxidation induced stress and defectivity in SIMOX and bonded SOI wafers may be found in *Proceedings of the* 1997 *IEEE International SOI Conference*, October 1997; Stress Induced Defect and Transistor Leakage for Shallow Trench Isolated SOI: IEEE Electron Device Letters, Vol. 20, No. 5, May 1999).

Under conditions that form sidewall oxide layers to a thickness of about 240 Å, a part of an SOI layer up to 4000 Å from the sidewall trench can be lifted. Even though the bending phenomenon is changed according to the degree and condition of sidewall oxidation, it cannot completely be prevented. It is therefore desirable to provide a method or methods of manufacturing semiconductor devices in a manner that eliminates or at least alleviates such bending.

SUMMARY OF THE INVENTION

Disclosed herein are methods for preventing bending of a patterned SOI layer during trench sidewall oxidation, a preferred method comprising providing a patterned SOI layer having at least one trench, said patterned SOI layer disposed upon an underlying buried silicon oxide layer; and blocking diffusion of oxygen between said patterned SOI and buried silicon oxide layer.

According to an aspect of the invention, there is provided a method wherein a nitrogen-containing layer is formed on an overall interface between a SOI layer and a buried silicon oxide layer that are included in a SOI-type substrate. A shallow trench isolation process is then carried out. As a method of forming the nitrogen-containing layer in the overall SOI-type substrate, deposition or nitridation is carried out in a nitrogen-containing gas ambient at the state of forming the SOI substrate. Alternatively, after forming the STI substrate, nitrogen-containing ion implantation is carried out.

According to a preferred method, a SOI layer is etched to form a trench on a SOI-type substrate. The SOI-type substrate having the trench is tilted to an angle and revolved. The angle of tilt will generally be held constant. A nitrogen-containing ion implantation is then carried out to form a nitrogen-containing layer on an interface between a SOI layer and a buried silicon oxide layer at an area adjacent to the trench.

According to another aspect of the invention, a SOI layer is etched to form a trench. A single-crystalline silicon layer is formed on a sidewall of the trench. Preferably, an etch-stop layer is stacked on a SOI-type substrate. A pattern to expose a trench area is formed. Using the pattern as an etching mask, a SOI layer of the SOI-type substrate is etched to form a trench. An amorphous silicon layer is conformally stacked on an overall surface of the SOI-type substrate. An annealing process is performed to obtain a solid phase epitaxial growth (SPE) of the amorphous silicon layer contacted with the sidewall of the trench composed of the SOI layer. A buried oxide layer is stacked to fill the trench. A planarization etching process is carried out to remove the buried oxide layer on the active region. In other words, the trench is formed in the SOI-type substrate and a temporary oxygen barrier layer is conformally stacked on the amorphous silicon layer. An SPE of the stacked amorphous silicon layer is got. In this case, the buried oxide layer is generally made of chemical vapor deposition (CVD) oxide.

According to still another aspect of the invention, a SOI layer is etched for device isolation. A trench is formed and a CVD oxide layer is conformally stacked on an overall surface of a substrate where the trench is formed. In this case, a liner for oxygen barrier can be stacked on an internal wall of the trench. Generally, the liner is stacked using a CVD stacking manner of a silicon nitride layer.

According to further another aspect of the invention, a trench for device isolation is formed on a SOI-type substrate and a rapid thermal processing (RTP) is performed to form an oxide layer. A liner for oxygen barrier may be formed on the oxide layer. Generally, the liner is stacked using a CVD stacking manner of a silicon nitride layer.

To achieve the above aspect of the invention, there is provided a semiconductor device for trench device isolation. According to one construction, the semiconductor device includes a lower silicon layer, a buried silicon oxide layer, and a SOI layer that are sequentially stacked on an active region. At least around the active region, a nitrogen-containing layer is formed between the buried silicon oxide layer and the SOI layer.

In a preferred semiconductor device, an oxide layer is formed on a lateral portion where a trench device isolation layer is contacted with the active region. The oxide layer is generally made of thermal oxide formed in a furnace, but may be made of CVD oxide or rapid thermal oxidation (RTO) oxide. Except the lateral portion, most of the trench device isolation layer is made of oxide to fill the trench.

According to another aspect of the semiconductor device for trench device isolation, the semiconductor device includes a lower silicon layer, a buried silicon oxide layer, a SOI layer that are sequentially stacked on an active region. A sidewall of the active region, contacted with a trench device isolation layer, is made of single-crystalline silicon by SPE. In this case, a thermal oxide layer and a silicon nitride liner may be formed on the single-crystalline silicon layer.

According to a preferred method, there is disclosed a method for preventing bending phenomenon of a silicon on insulator (SOI) layer, the method comprising the forming of a SOI-type substrate including a lower silicon layer, a buried oxide silicon layer, a SOI layer, and a nitrogen-containing layer between the buried oxide silicon layer and the SOI layer; and etching the SOI layer of the SOI-type substrate to form a trench for device isolation.

A further aspect of the method is disclosed wherein the nitrogen-containing layer is formed by implanting nitrogen ions in the step of forming the SOI-type substrate.

Still yet a further aspect of the method is disclosed wherein the nitrogen ions are implanted in a state of forming a pad oxide layer on a surface of the SOI layer.

According to a preferred method for preventing a bending phenomenon of a silicon on insulator (SOI) layer, there is disclosed a method comprising the etching of a SOI layer of a SOI-type substrate including a lower silicon layer, a buried oxide silicon layer, and a SOI layer to form a trench; and tilting the SOI-type substrate where the trench is formed and implanting nitrogen ions thereinto, forming a nitrogen-containing layer between the SOI layer and the buried oxide silicon layer at an area adjacent to the trench.

DESCRIPTION OF PREFERRED EMBODIMENTS

Six preferred methods according to embodiments of the present invention for preventing an SOI layer from bending and a semiconductor device formed by the methods are described.

First Method

Figure 1:
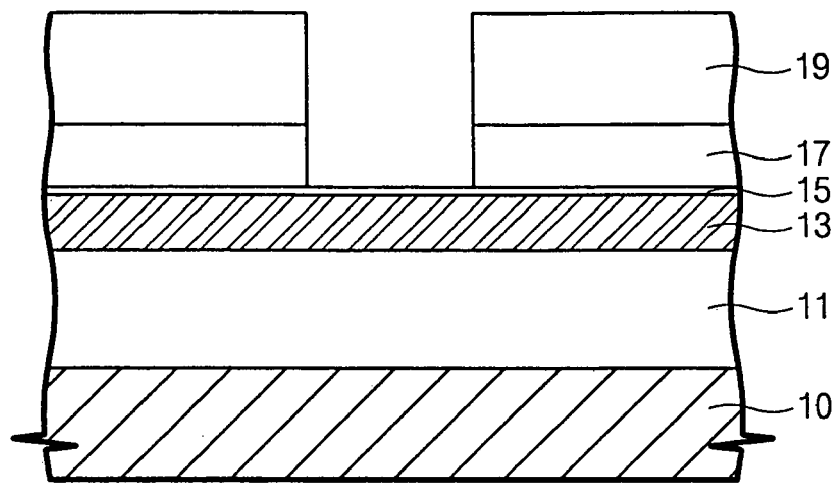
FIG. 1 to FIG. 3 are cross-sectional flow diagrams showing a bending phenomenon occurring when trench device isolation is performed on a conventional SOI substrate.
Figure 2:
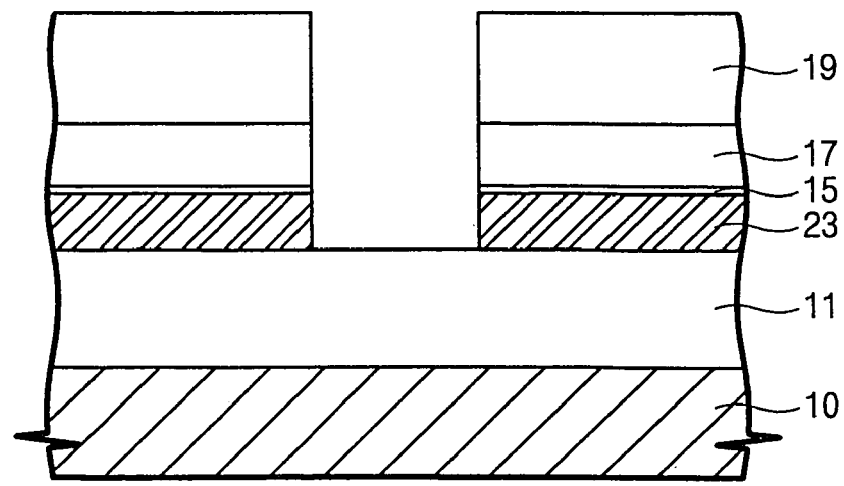
Figure 3:
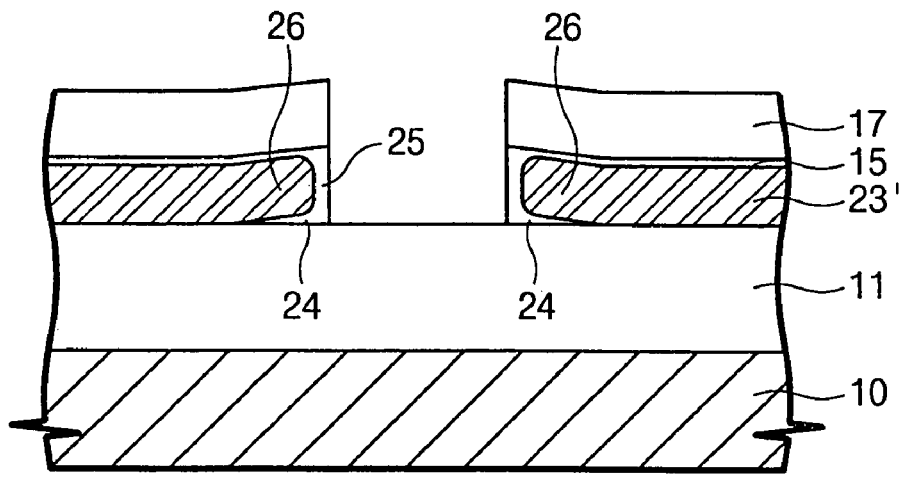
Figure 4:
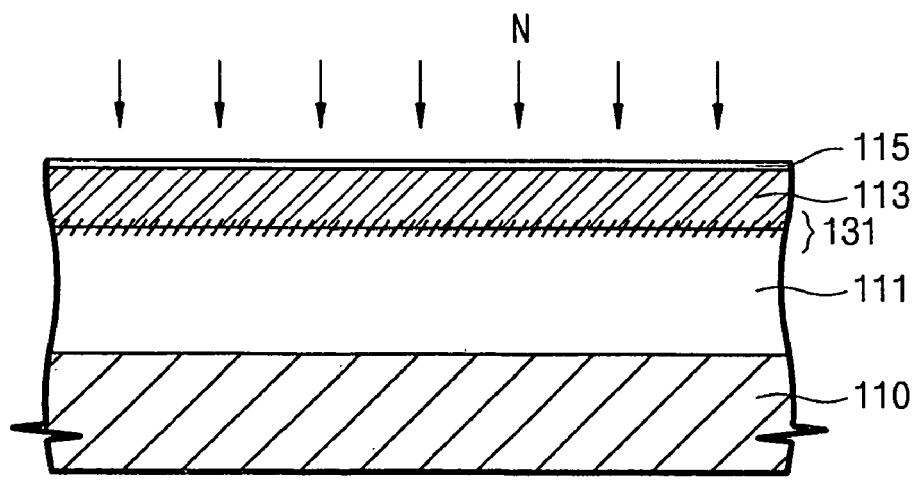
FIG. 4 to FIG. 6 are cross-sectional flow diagrams showing a feature in accordance with a first embodiment of the present invention.
Figure 5:
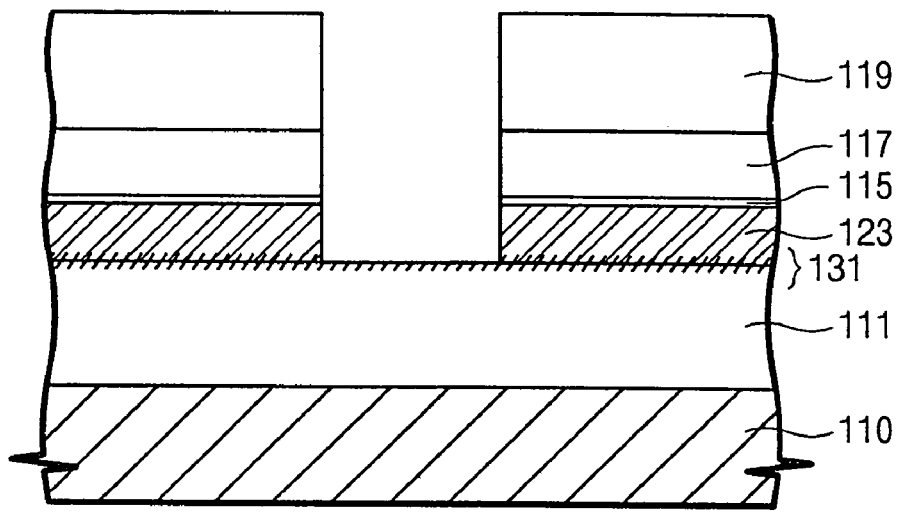
Figure 6:
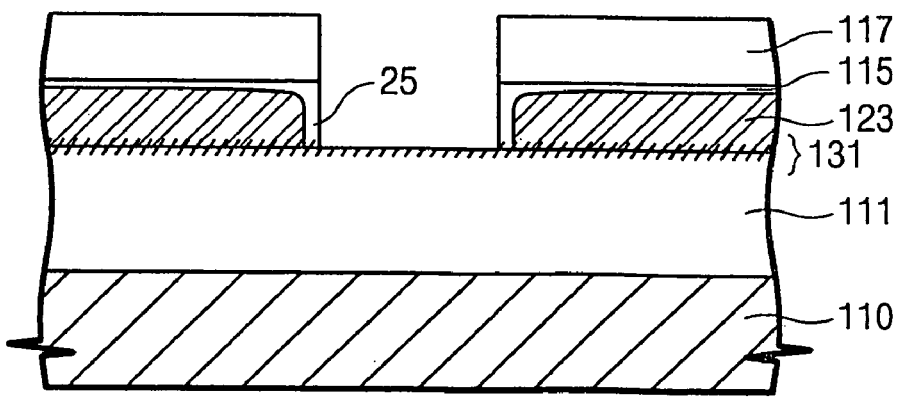

FIG. 4 to FIG. 6 are flow diagrams showing forming a nitrogen-containing layer on an interface between an SOI layer and a silicon oxide layer according to one aspect of the invention.

Referring to FIG. 4, an SOI-type substrate comprises a lower silicon layer 110, a buried silicon oxide layer 111, and an SOI layer 113 for forming a device that are sequentially stacked. A pad oxide layer 115 is formed on a surface of the SOI-type substrate. Nitrogen-containing ions are implanted into an overall surface of the SOI-type substrate, forming a nitrogen-containing layer 131.

Ion implantation energy enables the implanted ions to have a peak value of concentration at an interface between the SOI layer 113 and the buried silicon oxide layer 111. The ion implantation energy is changed according to a thickness of the pad oxide layer 115 and the SOI layer 113, but generally has a range of 30-100 keV.

Referring to FIG. 5, a silicon nitride layer 117 serving as an etch-stop layer for forming a trench is stacked on an SOI layer where a pad oxide layer 115 is formed. Using a conventional (or other suitable) photolithographic process, a photoresist pattern 119 to expose a device isolation trench area is formed on the silicon nitride layer 117. Using the photoresist pattern 119 as an etching mask, the silicon nitride layer 117 and the pad oxide layer are etched. The SOI layer is then etched to expose a buried silicon oxide layer. With an patterned SOI layer 123 formed, a trench is formed. Before etching the SOI layer, the photoresist pattern 119 may be removed.

Referring to FIG. 6, in order to cure a crystalline defect of a trench sidewall that is attacked in a trench etching step, thermal oxidation is carried out to an SOI-type substrate where the trench is formed. The thermal oxidation may then be carried out, such as in a furnace at a temperature of 900° C. for 15 minutes. A thermal oxide layer 25 typically having a thickness of 200–300 Å is formed on the trench sidewalls defined by the patterned SOI layer 123. A nitrogen-containing layer 131 such as a silicon nitride layer or a silicon oxide nitride layer is formed at an interface between the patterned SOI layer 123 and the buried silicon oxide layer 111. Therefore, the interface serving as an oxygen-diffusing path is eliminated, because oxygen is not easily diffused between a silicon layer and a silicon nitride layer or a silicon oxynitride layer. Although not shown in detail, it may be mentioned in passing that the pad oxide layer 115, where thickly formed on the trench sidewall, will expand and slightly bend the silicon nitride layer above it.

In this embodiment, a pad oxide layer 115 on an SOI layer is shown, but it should be noted that forming the pad oxide layer is not essential. After thermal oxidation, a silicon nitride liner may be formed on the trench and then a buried oxide layer, such as a CVD oxide layer, filled in the trench to achieve device isolation.

Second Method

Figure 7:
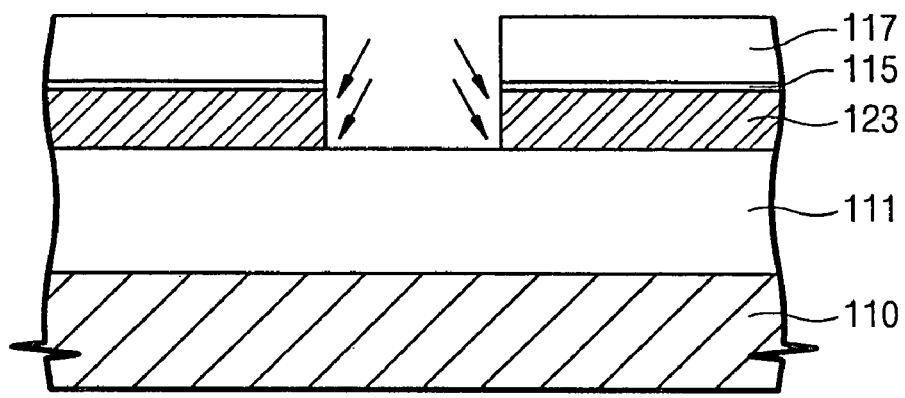
FIG. 7 is a cross-sectional diagram showing a feature in accordance with a second embodiment of the present invention.

FIG. 7 shows a state of implanting nitrogen ions into a trench that is formed on an SOI substrate comprising a lower silicon layer 110, a buried silicon oxide layer 111, and an patterned SOI layer 123. Using a pattern of an etch-stop layer as an etching mask, the patterned SOI layer 123 is etched to form the trench. When implanting the nitrogen ions thereinto, a lower energy of about 10 keV is applied. Because a substrate where the trench is formed is tilted at an angle (usually about 15°), arrows indicating ion-implanting directions are also tilted. In the ion-implanting process, the substrate is revolved to enable the nitrogen ions to be implanted into exposed sidewalls of all the layers of the trench. In this case, a partial area between the SOI layer and the buried silicon oxide layer is significant. Around an active region contacted with the trench, the nitrogen ions are implanted to form a nitrogen-containing layer therebetween. In the following annealing process of an oxygen ambient, the nitrogen-containing layer will be expanded through an interface therebetween. In spite of a constant width, the nitrogen-containing layer serves to prevent partial oxidation of a lower part of the SOI layer.

After forming an oxide layer or a nitride layer on the sidewalls, filling a remaining part of the trench with an insulating layer is performed.

Third Method

Figure 8:
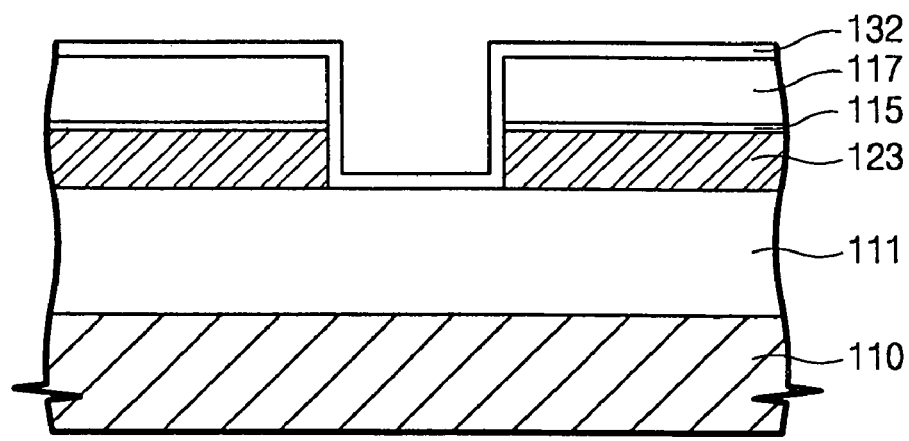
FIG. 8 to FIG. 9 are cross-sectional diagrams showing a feature in accordance with a third embodiment of the present invention.

FIG. 8 shows a state of stacking a silicon oxide layer on an overall surface of an SOI-type substrate where an patterned SOI layer 123 and a trench are formed, using a CVD technique. The CVD technique is a low pressure chemical vapor deposition (LPCVD) that is performed at a temperature of about 700–750° C. The LPCVD technique at a temperature of about 700° C. or more, is helpful to cure crystalline defects caused by etching. The CVD oxide layer 132 serves as a protection layer of the trench sidewalls. Nonetheless, a bending phenomenon does not occur because a wedged thermal oxide layer is not formed due to the low pressures and temperature of the LPCVD process.

Figure 9:
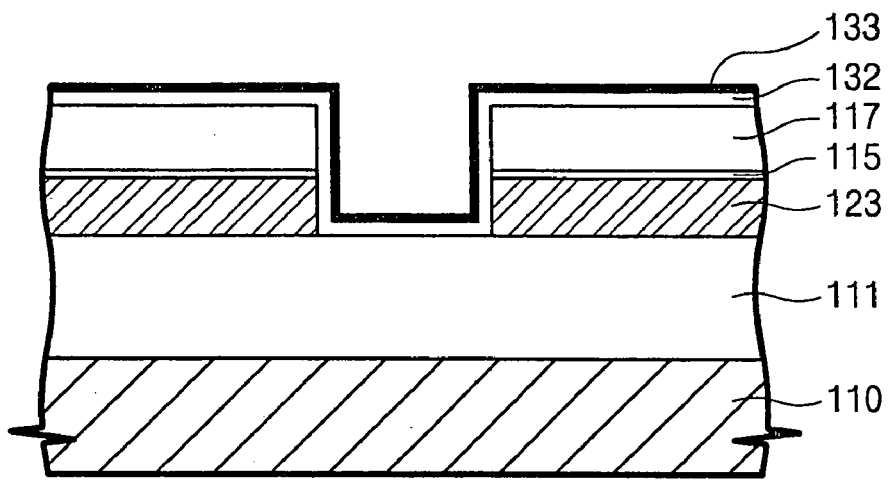

Referring to FIG. 9, an optional additional procedure of further stacking an oxygen barrier layer 133 is shown. To prevent an SOI layer from bending upon subsequent oxidation in a state shown in FIG. 8, an oxidation barrier layer 133 is deposited on a CVD oxide layer 132 to a thickness of 30–300 Å. The oxidation barrier layer 133 may be made of $Si_3N_4$, SiON, or $AlO_3$. The subsequent oxidation is to form a screen oxide layer and a gate oxide layer on an active region, comprising a patterned SOI layer 123, before implanting ions into the SOI layer. Subsequent oxidation may additionally or alternatively be performed to oxidize a sidewall of a polysilicon gate electrode.

Fourth Method

Figure 10:
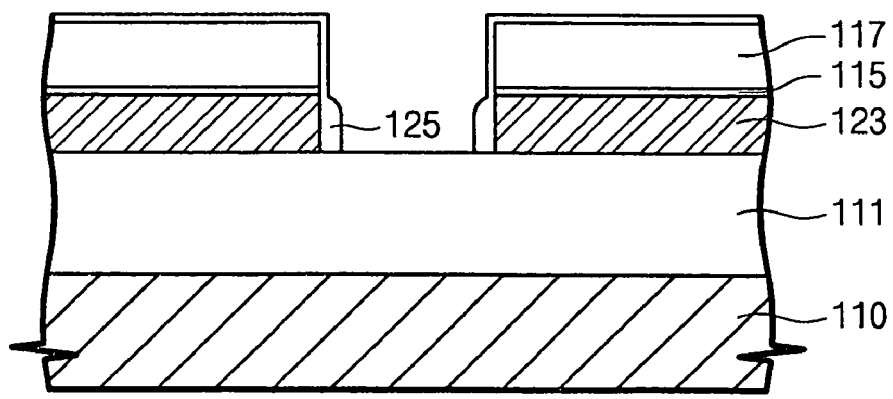
FIG. 10 is a cross-sectional diagram showing a feature in accordance with a fourth embodiment of the present invention.

Referring now to FIG. 10, rapid thermal oxidation (RTO) for device isolation is carried out on an SOI-type substrate where a trench is etched and formed. Unlike a thermal oxidation in a conventional furnace, the thermal oxidation is carried out on the sidewalls of a silicon layer, namely the patterned SOI layer 123, at a temperature of about 950–1180° C. for about 30–200 seconds. This leads to formation of a sidewall oxide layer 125. Diffusion of oxygen through an interface between the oxide layer and the silicon layer so as to oxidize the silicon layer is in proportion to the processing temperature and time. Thus, because the processing time is shortened, oxidation and its resultant bending are reduced.

Fifth Method

Figure 11:
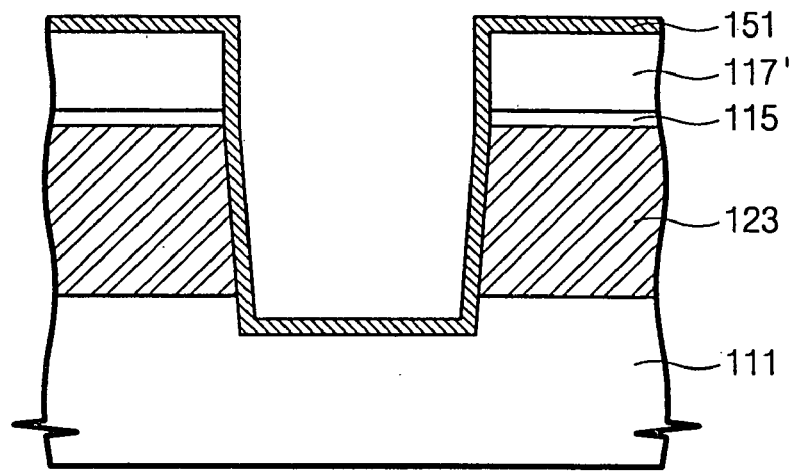
FIG. 11 to FIG. 14 are cross-sectional diagrams showing a flow in accordance with a fifth embodiment of the present invention.

Referring to FIG. 11, there is a silicon nitride layer pattern 117' for forming a trench on an SOI-type substrate where a patterned SOI layer 123 and the trench are formed by etching an SOI layer. An amorphous silicon layer 151 is then conformally stacked to a thickness of about 50–300 Å on the surface of the resulting structure.

Figure 12:
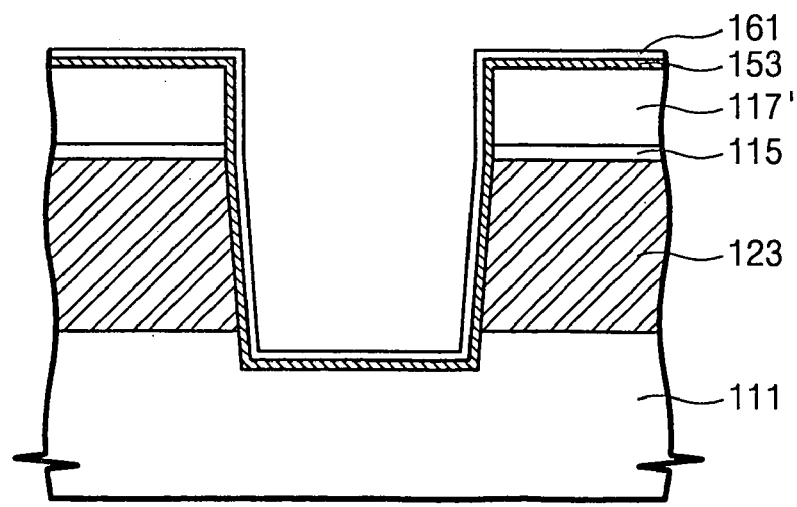

Referring to FIG. 12, conventional trench sidewall oxidation is carried out on an SOI-type substrate where an amorphous silicon layer is stacked. In this case, the thickness of the oxidation is less than the total thickness of the amorphous silicon layer 153. Consequently, a surface contacted with oxygen on the stacked amorphous silicon layer is oxidized to form a surface oxide layer 161 having a thickness of about 30–250 Å and a remaining amorphous silicon layer 153. At the amorphous silicon layer 153 contacted with the patterned SOI layer 123 (i.e., trench sidewall), a crystalline defect of the SOI layer can be cured by a high temperature that is applied to thermal oxidation and solid phase epitaxial growth (SPE) may partially be achieved.

Figure 13:
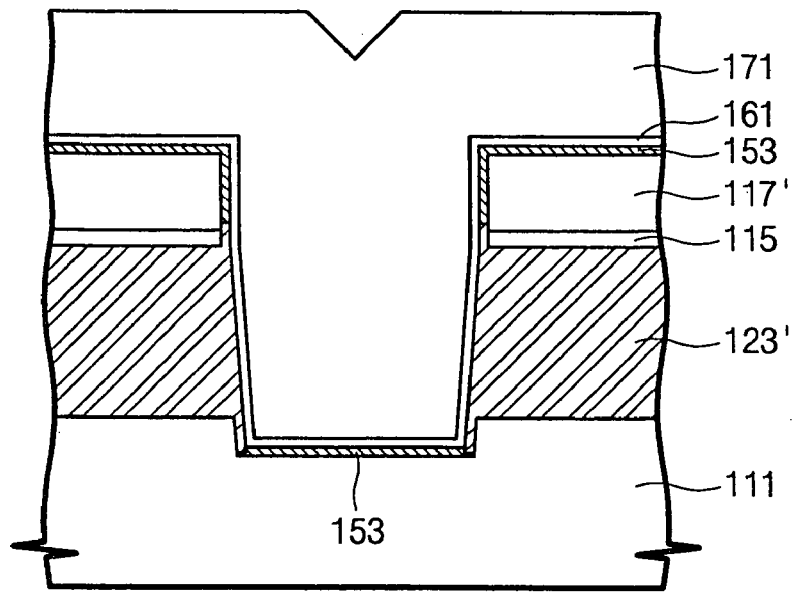

Referring to FIG. 13, using a CVD technique, a trench oxide layer 171 to fill a trench is stacked on the surface oxide layer 161. Before forming the trench oxide layer 171, a thin silicon nitride liner may optionally be stacked (not shown). Annealing is carried out at a temperature of about 750–1150° C. for an hour, and may be followed by another annealing for densifying the trench oxide layer 171 and lowering a wet etching rate. Preferably, the annealing is carried out in a nitrogen ambient. SPE is achieved at the remaining silicon layer 153 of a part contacted with an SOI layer during the one annealing, forming an expanded SOI pattern 123'. Meanwhile, a non-SPE part will be an oxide layer in the following process. Therefore, insulation problems caused by any remaining amorphous silicon layer in that region is avoided.

Figure 14:
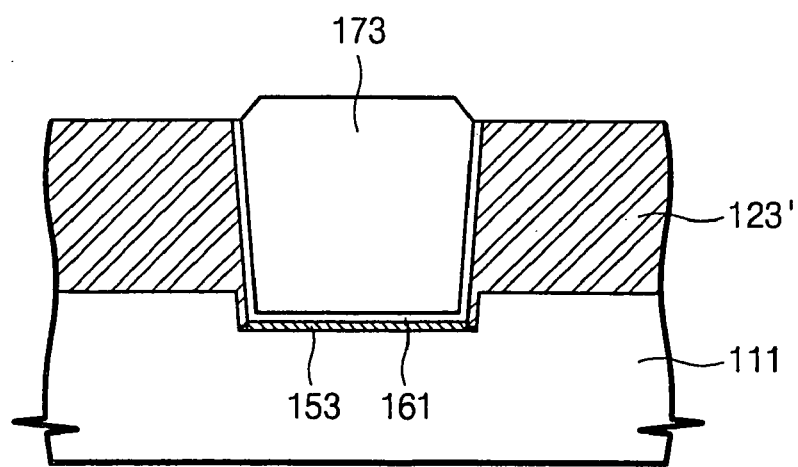

Referring to FIG. 14, excess trench oxide layer is removed with chemical mechanical polishing (CMP) so as to leave a device isolation layer 173 filling a trench. Then, the silicon nitride layer serving as an etch-stop layer and the pad oxide layer may then be removed as desired.

Sixth Method

Figure 15:
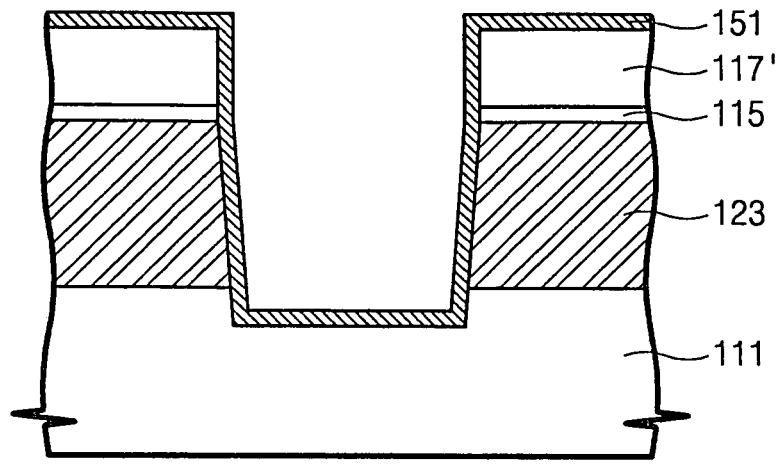
FIG. 15 to FIG. 18 are cross-sectional diagrams showing a flow in accordance with a sixth embodiment of the present invention.

Referring to FIG. 15, there is a silicon nitride layer pattern 117' for forming a trench on an SOI-type substrate where the trench for device isolation are formed by etching an SOI layer. An amorphous silicon layer 151 is then conformally stacked, to a thickness of about 50–300Å, on the surface of the resulting structure.

Figure 16:
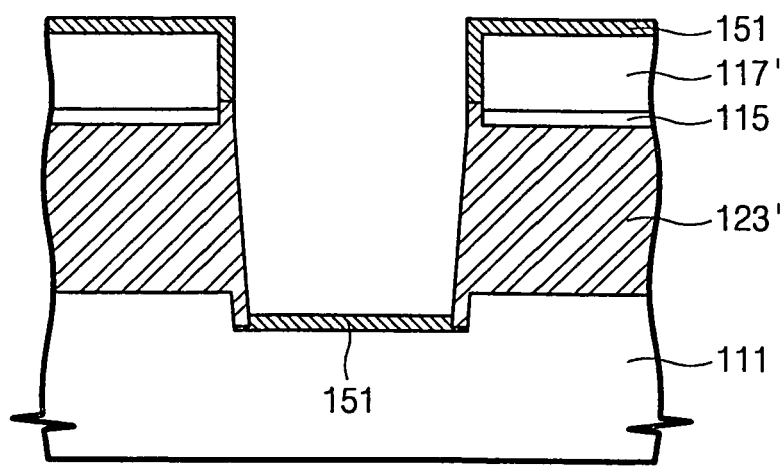

Referring to FIG. 16, annealing is carried out on a substrate where an amorphous silicon layer 151 is stacked, at a temperature of about 550–700° C. for an hour, such as in a conventional furnace or an ultra high vacuum (UHV) system without oxygen (such as under nitrogen). The amorphous silicon layer 151 is recrystallized, and SPE is achieved at a part adjacent to an patterned SOI layer 123 owing to the influence of the single crystalline structure of the patterned SOI layer 123. As a result, an expanded patterned SOI layer 123' is formed.

Figure 17:
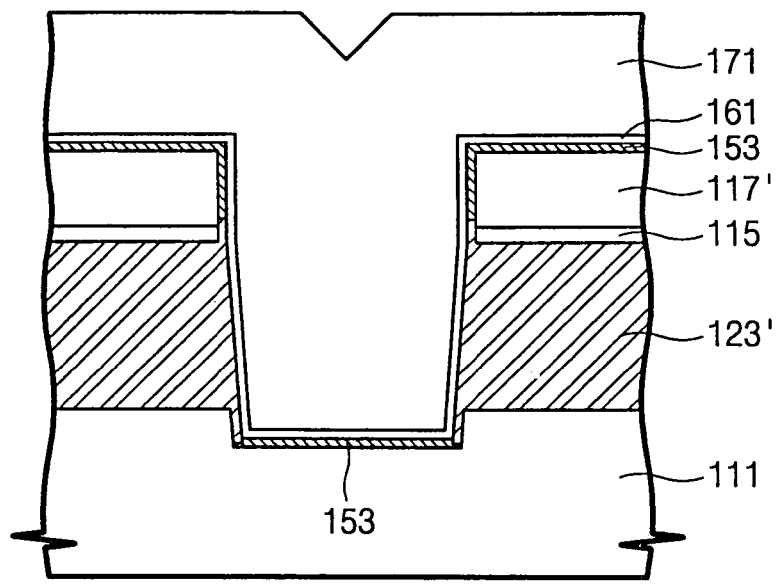

Referring to FIG. 17, a sidewall oxidation is then performed to form a surface oxide layer 161. A trench oxide layer 171 is stacked to fill a trench. Similar to a conventional trench device isolation process, annealing to the trench oxide layer 171 usually follows. A portion of the original amorphous silicon layer of FIG. 16 remains unoxidized and is identified as a remaining silicon layer 153.

Figure 18:
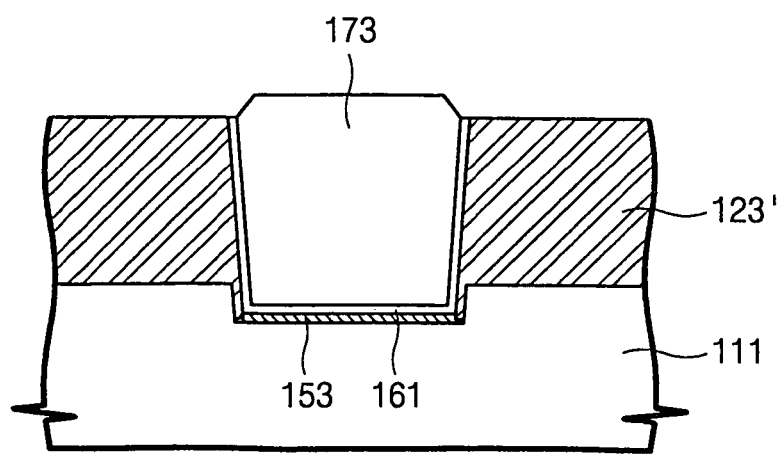

Referring to FIG. 18, the trench oxide layer 171 is removed over an patterned SOI layer 123' that is an active region, by a planarization etching process using a CMP technique. Only a device isolation layer 173 remains thereof. Then, the silicon nitride layer serving as an etching mask in trench patterning and the pad oxide layer are removed. Before stacking a trench oxide layer, a silicon nitride liner (not shown) may conformally be stacked.

In an annealing process for SPE a crystalline defect of an SOI layer is cured. Therefore, it is often desirable to forgo separate sidewall thermal oxidation. A silicon layer, particularly a remaining silicon layer 153 on a trench bottom, may remain because thermal oxidation is not carried out. But the remaining silicon layer 153 is oxidized in the subsequent oxidation, so that insulation problems caused thereby are avoided.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A trench device isolation type semiconductor device having a buried silicon oxide layer, and a silicon on insulator (SOI) layer in an active region, comprising:
   a nitrogen-containing layer formed between the buried silicon oxide layer and the SOI layer, around at least the active region.

2. The device of claim 1, wherein a trench device isolation layer includes an oxide layer at a side contacted with the active region.

3. The device of claim 2, wherein the oxide layer is made of one selected from the group consisting of thermal oxide, CVD oxide, and oxide created by rapid thermal oxidation (RTP) technique.

4. The device of claim 2 further comprising a silicon nitride liner at the opposite side of the substrate on the basis of the oxide layer.

5. A trench device isolation type semiconductor device, comprising:
   a buried silicon oxide layer and a silicon on insulator (SOI) layer in an active region;
   a single crystalline silicon layer formed by solid phase epitaxial growth (SPE) of a sidewall of the active region contacted with a device isolation layer of the trench.

6. The device of claim 5 further comprising a thermal oxide layer at the opposite side of the active region on the basis of the single crystalline silicon layer.

7. The device of claim 6 further comprising a silicon nitride liner at the opposite side of the single crystalline silicon layer on the basis of the thermal oxide layer.

8. A trench device isolation type semiconductor device having a buried silicon oxide layer, and a silicon-on-insulator (SOI) layer in an active region, comprising:
   means for blocking the diffusion of oxygen between said SOI layer and said buried silicon oxide layer, said means for blocking formed between SOI layer and said buried oxide layer.

* * * * *